(12) United States Patent
Liu et al.

(10) Patent No.: US 8,748,926 B2
(45) Date of Patent: Jun. 10, 2014

(54) CHIP PACKAGE WITH MULTIPLE SPACERS AND METHOD FOR FORMING THE SAME

(71) Applicant: Xintec Inc., Jhongli (TW)

(72) Inventors: Kuo-Hua Liu, Pingzhen (TW); Yi-Ming Chang, Pingzhen (TW); Hsi-Chien Lin, Zhubei (TW)

(*) Notice: Subject to any disclaimer, the term of this patent is extended or adjusted under 35 U.S.C. 154(b) by 0 days.

(21) Appl. No.: 13/720,649

(22) Filed: Dec. 19, 2012

(65) Prior Publication Data
US 2013/0154077 A1    Jun. 20, 2013

Related U.S. Application Data

(60) Provisional application No. 61/577,505, filed on Dec. 19, 2011.

(51) Int. Cl.
*H01L 33/00* (2010.01)
*H01L 21/00* (2006.01)

(52) U.S. Cl.
USPC ............. 257/98; 438/22; 438/27; 438/29

(58) Field of Classification Search
USPC ............ 257/684, 98–100, 432–436, 680, 257/E23.009, E23.01; 438/22, 25, 26, 27, 438/29, 48, 65, 64, 69, 70, 116, 108, 612, 438/666
See application file for complete search history.

(56) References Cited

U.S. PATENT DOCUMENTS

| | | | |
|---|---|---|---|
| 7,394,028 B2 * | 7/2008 | Cohn | 174/262 |
| 8,044,475 B2 * | 10/2011 | Lin et al. | 257/432 |
| 2004/0038452 A1 * | 2/2004 | Pu | 438/116 |
| 2009/0316105 A1 * | 12/2009 | Oh et al. | 349/189 |

* cited by examiner

*Primary Examiner* — Matthew Reames
*Assistant Examiner* — Dilinh Nguyen
(74) *Attorney, Agent, or Firm* — Liu & Liu

(57) ABSTRACT

A chip package includes: a substrate having a first and a second surfaces; a device region formed in or disposed on the substrate; a dielectric layer disposed on the first surface; at least one conducting pad disposed in the dielectric layer and electrically connected to the device region; a planar layer disposed on the dielectric layer, wherein a vertical distance between upper surfaces of the planar layer and the conducting pad is larger than about 2 μm; a transparent substrate disposed on the first surface; a first spacer layer disposed between the transparent substrate and the planar layer; and a second spacer layer disposed between the transparent substrate and the substrate and extending into an opening of the dielectric layer to contact with the conducting pad, wherein there is substantially no gap between the second spacer layer and the conducting pad.

32 Claims, 7 Drawing Sheets

US 8,748,926 B2

CHIP PACKAGE WITH MULTIPLE SPACERS AND METHOD FOR FORMING THE SAME

CROSS REFERENCE TO RELATED APPLICATIONS

This Application claims the benefit of U.S. Provisional Application No. 61/577,505, filed on Dec. 19, 2011, the entirety of which is incorporated by reference herein.

BACKGROUND OF THE INVENTION

1. Field of the Invention

The invention relates to a chip package, and in particular, relates to a chip package formed by a wafer-level packaging process.

2. Description of the Related Art

A packaging process of chip packages is one important step in forming electronic products. A chip package not only provides protection for the chips from environmental contaminants, but also provides a connection interface for internal electronic elements of chips packaged therein.

In the conventional wafer-level packaging process, problems regarding bad bonding and/or moisture invasion may occur, which negatively affects the performance of the packaged chip. In addition, it is easy for the chip package to be broken due to the dicing process.

Thus, it is desired to have an improved chip packaging technology.

BRIEF SUMMARY OF THE INVENTION

An embodiment of the invention provides a chip package which includes: a substrate having a first surface and a second surface; a device region formed in the substrate or disposed on the substrate; a dielectric layer disposed on the first surface of the substrate; at least one conducting pad disposed in the dielectric layer and electrically connected to the device region; a planar layer disposed on the dielectric layer, wherein a vertical distance between an upper surface of the planar layer and an upper surface of the conducting pad is larger than about 2 μm; a transparent substrate disposed on the first surface of the substrate; a first spacer layer disposed between the transparent substrate and the planar layer; and a second spacer layer disposed between the transparent substrate and the substrate and extending into an opening of the dielectric layer to contact with the conducting pad, wherein there is substantially no gap between the second spacer layer and the conducting pad.

An embodiment of the invention provides a chip package which includes: a substrate having a first surface and a second surface; a device region formed in the substrate or disposed on the substrate; a dielectric layer disposed on the first surface of the substrate; at least one conducting pad disposed in the dielectric layer and electrically connected to the device region; a planar layer disposed on the dielectric layer; a transparent substrate disposed on the first surface of the substrate; a first spacer layer disposed between the transparent substrate and the planar layer; and a second spacer layer disposed between the transparent substrate and the substrate, wherein the second spacer layer comprises a main portion and an extending portion, and the extending portion covers a surface of the main portion and extends onto an opening of the dielectric layer to contact with the conducting pad.

An embodiment of the invention provides a method for forming a chip package which includes: providing a substrate having a first surface and a second surface, wherein a device region is formed in the substrate or disposed on the substrate, a dielectric layer is disposed in the first surface of the substrate, at least one conducting pad is disposed in the dielectric layer and electrically connected to the device region, and a planar layer is disposed on the dielectric layer; providing a transparent substrate; forming a patterned spacer layer on a surface of the transparent substrate, wherein the patterned spacer layer comprises a first spacer layer and a second spacer layer, the first spacer layer surrounds a region on the transparent substrate, and the second spacer layer surrounds the first spacer layer; disposing a spacer layer material on an upper surface of the second spacer layer; and disposing the substrate on the transparent substrate, wherein the first spacer layer directly contacts with the planar layer, and the spacer layer material bonds with the dielectric layer and fills an opening of the dielectric layer to contact with the conducting pad.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of chips. For example, the chip package of the embodiments of the invention may be applied to the package active or passive devices, or electronic components with digital or analog circuits, such as optoelectronic devices, microelectromechanical systems (MEMS), microfluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, microactuators, surface acoustic wave devices, pressure sensors, ink printer heads, or power IC modules.

The wafer-scale packaging process mentioned above mainly means that after the packaging process is accomplished during the wafer stage, the wafer with chips is cut to obtain separate independent packages. However, in a specific embodiment, separate independent chips may be redistributed overlying a supporting wafer and then be packaged, which may also be referred to as a wafer-scale packaging process. In addition, the above mentioned wafer-scale packaging process may also be adapted to form chip packages of multi-layer integrated circuit devices by stacking a plurality of wafers having integrated circuits. In one embodiment, the diced package is a chip scale package (CSP). The size of the chip scale package (CSP) may be only slightly larger than the size of the packaged chip. For example, the size of the chip package is not larger than 120% of the size of the packaged chip.

Figure 1:
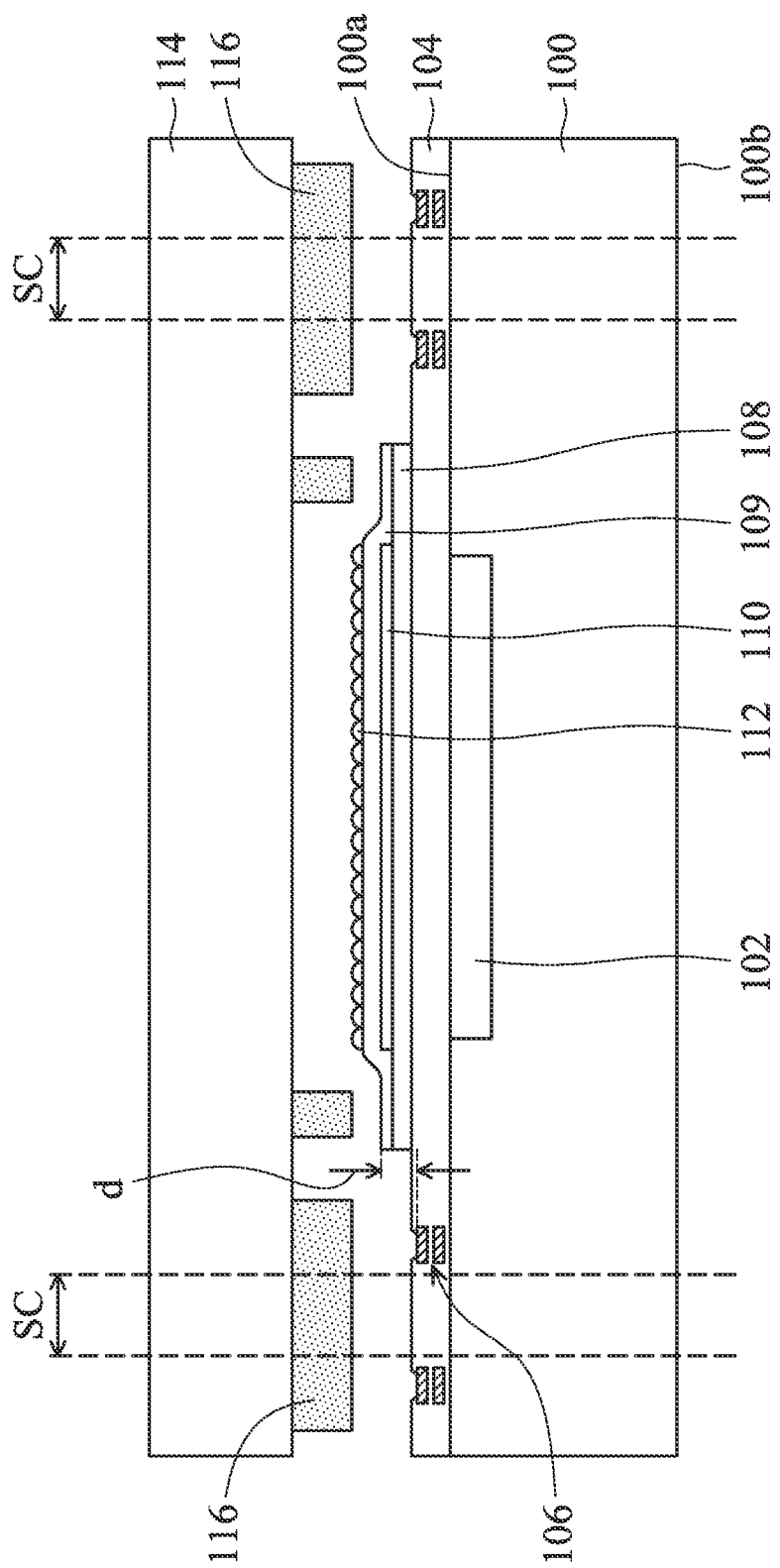
FIG. 1 is a cross-sectional view showing the steps for forming a chip package according to an embodiment of the present invention.

FIG. 1 is a cross-sectional view showing the step of forming a chip package of an embodiment of the present invention. In one embodiment, a substrate 100 is provided, which has a surface 100a and a surface 100b. The substrate 100 may be a semiconductor wafer such as a silicon wafer. The substrate 100 may be divided into a plurality of die regions by a plurality of predetermined scribe lines SC. Each of the die regions may have a device region 102 formed therein. The device region 102 may include, for example, an image sensor device or a light emitting device. Elements in the device region 102 may be electrically connected to a conducting pad 106 in a dielectric layer 104 on the substrate 100. For example, multilayer interconnection structures may be formed in the dielectric layer 104 to electrically connect the elements in the device region 102 to the conducting pad.

An optical element may be formed in the dielectric layer 104 for assisting light which enters the device region 102 or which is emitted by the device region 102. For example, the optical element may include a light filter layer, a color filter layer, a polarization layer, a lens, or combinations thereof. In order to dispose the optical element, a planar layer may be needed to be formed on the dielectric layer 104 for facilitating the disposing of the optical elements. For example, in the embodiment shown in FIG. 1A, a planar layer 108 may be formed on the dielectric layer 104, which may have a material such as a polymer material and have a substantially planar upper surface. Then, a light filter layer 110 may be disposed on the planar layer 108. Another planar layer 109 may be formed on the light filter layer 110. A lens 112 which is, for example, a microlens array may be disposed on a substantially planar upper surface of the planar layer 109.

In the embodiment shown in FIG. 1, a transparent substrate 114 may be disposed on the surface 100a of the substrate 100. The transparent substrate 114 may protect the optical element and serve as a support substrate in subsequent process steps. In order to prevent the transparent substrate 114 from directly contacting with the optical element (such as the lens 112), a spacer layer 116 may be disposed on the transparent substrate 114, and the transparent substrate 114 may be bonded on the dielectric layer 104 on the substrate 100 through the spacer layer 116. In one embodiment, the spacer layer 116 includes an inner track portion used for bonding with the planar layer 109 and an outer track portion used for bonding with the dielectric layer 104. After the transparent substrate 114 is disposed on the substrate 100, the inner track portion of the spacer layer 116 together with the substrate 100 and the transparent substrate 114 may surround a cavity on the device region 102, which may be used for containing the optical elements.

Typically, the outer track portion of the spacer layer 116 surrounds the inner track portion and covers the conducting pad 106. The outer track portion of the spacer layer 116 extends across the predetermined scribe line SC and is disposed along the predetermined scribe line SC. In addition, it is preferable for the spacer layer 116 to substantially and/or completely fill the opening of the dielectric layer 104 which exposes the conducting pad 106. Thus, when a dicing process is subsequently performed along the predetermined scribe lines SC, damage caused by the dicing process may be prevented since the outer track portion of the spacer layer 116 fills the opening in the dielectric layer 104 to contact with the conducting pad 106.

However, in some embodiments, a vertical distance d between the upper surface of the planar layer 109 and an upper surface of the conducting pad 106 may be larger than about 2 μm, which causes the outer track of the spacer layer 116 to not completely bond with the dielectric layer 104 and fill the opening of the dielectric layer 104. Thus, when the dicing process is subsequently performed, the chip package may suffer from damage.

In order to reduce and/or resolve the problems mentioned above, the inventor of the application proposes a method for forming a chip package according to an embodiment of the invention. FIGS. 2A-2F are cross-sectional views showing the steps of forming a chip package according to another embodiment of the present invention, wherein same or similar reference numbers are used to designate same or similar elements.

Figure 2A:
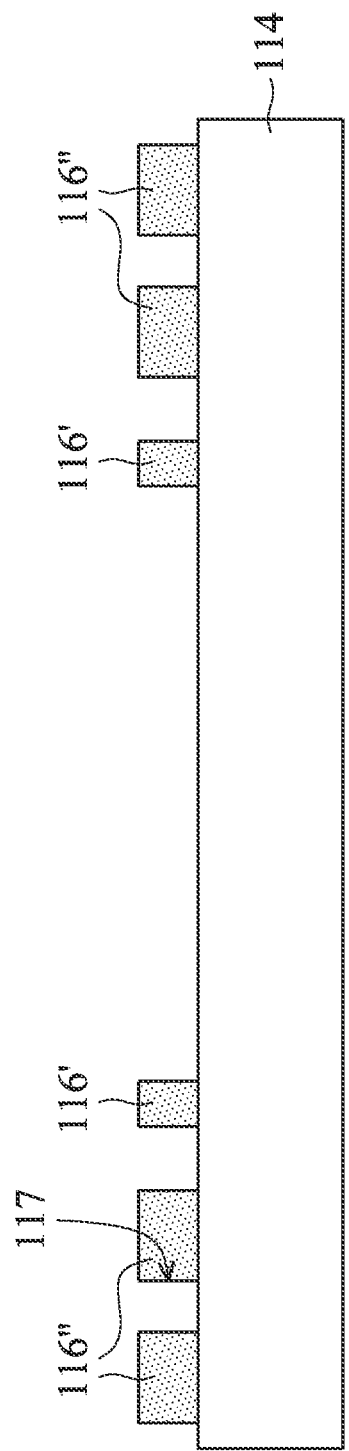
FIGS. 2A-2F are cross-sectional views showing the steps for forming a chip package according to an embodiment of the present invention.

As shown in FIG. 2A, a transparent substrate 114 is provided. The transparent substrate 114 may include (but is not limited to) a glass substrate, quartz substrate, transparent polymer substrate, or combinations thereof. Then, a patterned spacer layer may be formed on the transparent substrate 114, which may include a spacer layer 116' and a spacer layer 116". The spacer layer 116' may surround a region on the transparent substrate 114, and the spacer layer 116" may surround the spacer layer 116'. In addition, the spacer layer 116" may include a recess 117. The recess 117 may be a plurality of holes or trenches. Because the spacer layer 116" has the recess 117 therein, the recess 117 may be used to release stress to prevent the chip package from being damaged when a dicing process is subsequently performed. In one embodiment, the patterned spacer layer may be formed by performing an exposure process and a development process to a photoresist layer formed on the transparent substrate 114. The material of the patterned spacer layer may be, for example, a silicone-based photoresist. In one embodiment, the materials of the spacer layer 116' and the spacer layer 116" are the same.

Figure 2B:
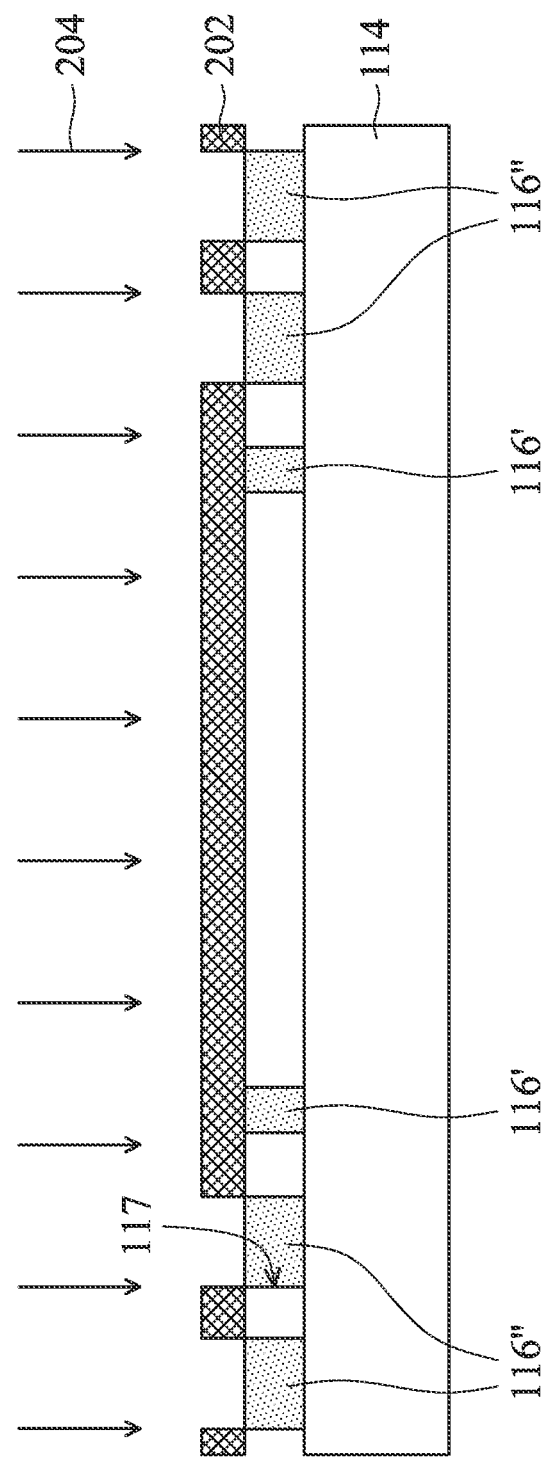

Next, a spacer layer material is disposed on the spacer layer 116". As shown in FIG. 2B, in one embodiment, a mask 202 may be disposed on the patterned spacer layer. The mask 202 may, for example, directly contact with the patterned spacer layer. The mask 202 may have holes only exposing the spacer layer 116". In addition, the mask 202 may cover the recess 117. Then, an application process 204 may be performed on the mask 202 to apply a spacer layer coating, wherein a portion of the spacer layer coating directly contacts with the upper surface of the spacer layer 116" through the holes of the mask 202.

Figure 2C:
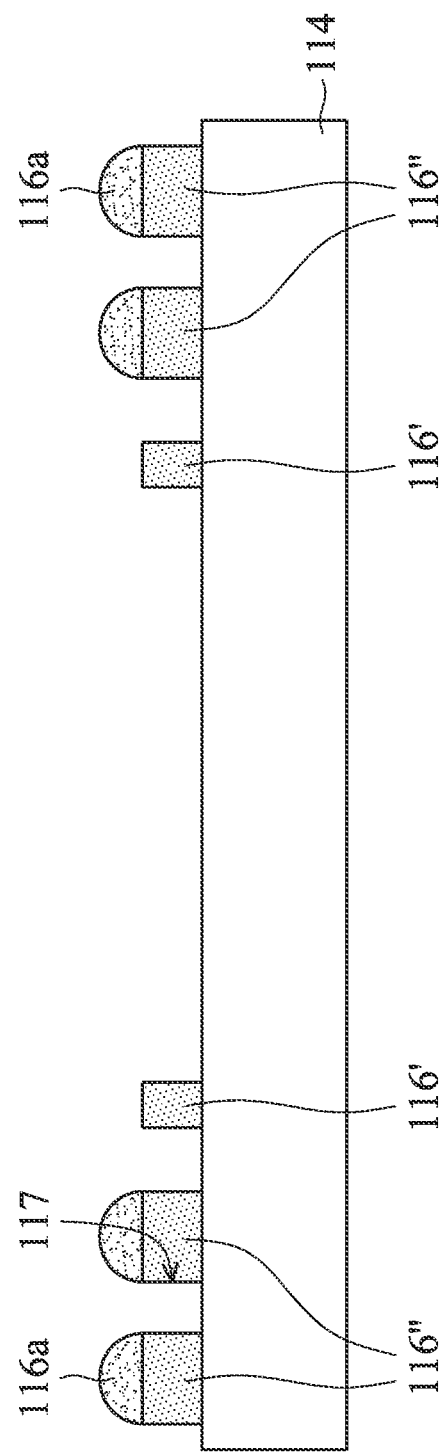

Then, the mask 202 may be removed, and a spacer layer material 116a is left on the upper surface of the spacer layer 116", as shown in FIG. 2C. In one embodiment, the material of the spacer layer material 116a is the same as that of the spacer layer 116".

Figure 2D:
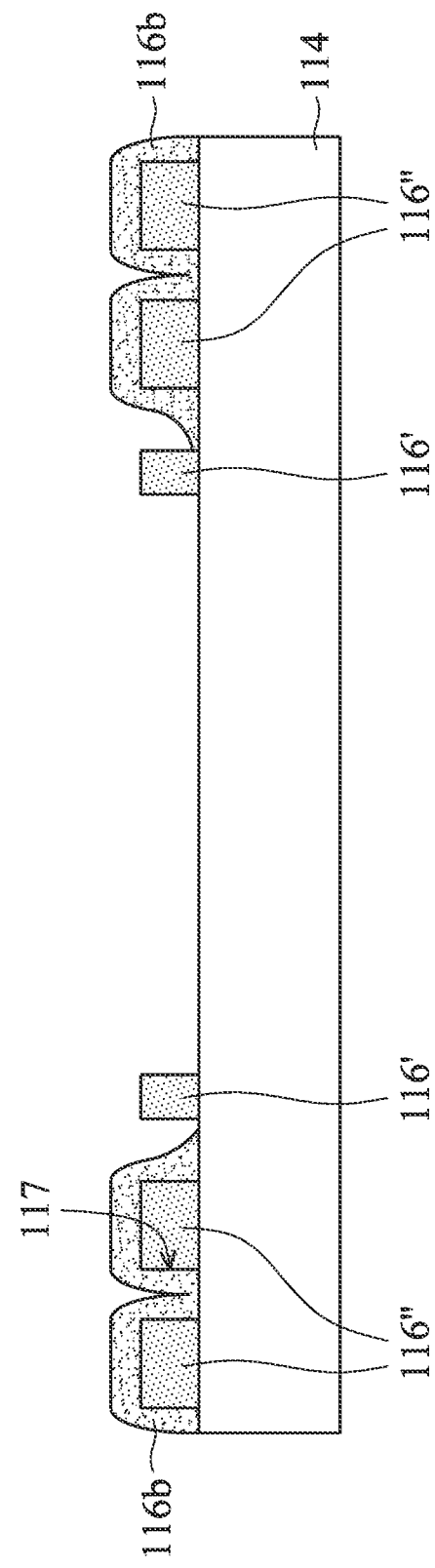

In one embodiment, the spacer layer material 116a may have fluid characteristics and flow towards a periphery of the spacer layer 116" to form a spacer layer material 116b, as shown in FIG. 2D. The spacer layer material 116b may flow into the recess 117 to partially fill the recess 117. In addition, the spacer layer material 116b may also flow towards the spacer layer 116'. In one embodiment, the spacer layer material 116b may directly contact with the spacer layer 116'. In addition, because of the blocking of the spacer layer 116', the spacer layer material 116b does not flow into the region surrounded via the spacer layer 116'. In one embodiment, the spacer layer material 116b covers a side surface of the spacer layer 116". It should be appreciated that the shape of the spacer layer material 116b is not limited to that shown in FIG. 2D. The shape of the spacer layer material 116b may depend on the material and the fluid characteristics of the spacer layer material 116b.

In one embodiment, a curing process may then be performed to the spacer layer material 116b. The curing process may include, for example, performing a soft bake process, a light illumination process, or combinations thereof to the spacer layer material 116b. The soft bake process may be performed at, for example, 100° C. In one embodiment, the spacer layer material 116b may first be cured by using a soft bake process, and then a light illumination process may then be used to crosslink the polymer in the spacer layer material 116b.

Figure 2E:
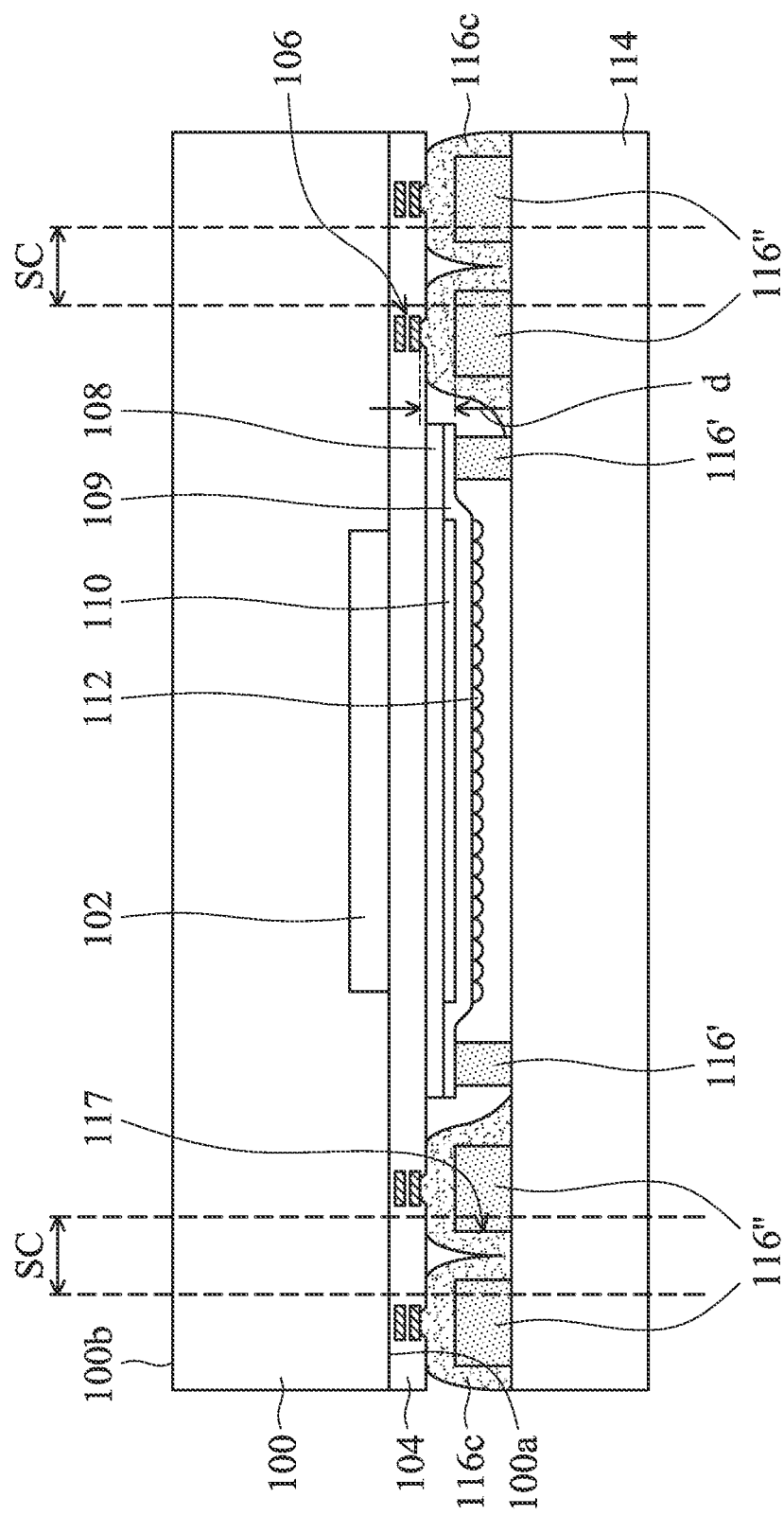

Next, as shown in FIG. 2E, a substrate 100 may be disposed on the transparent substrate 114 by performing a bonding process similar to that shown in FIG. 1, wherein the spacer layer 116' bonds onto a planar layer 109, and the spacer layer material 116b bonds with a dielectric layer 104 and fills an opening of the dielectric layer 104 to contact with a conducting pad 106. The conducting pad 106 in the dielectric layer 104 may be electrically connected to elements in a device region 102 on the substrate 100. For example, multilayer interconnection structures may be formed in the dielectric layer 104 to electrically connect the elements in the device region 102 to the conducting pad 106. In one embodiment, there is substantially no gap between the spacer layer material 116b (or a spacer layer material 116c, to be illustrated) and the conducting pad 106. In one embodiment, the spacer layer 116' directly contacts with the planar layer 109 without contacting with the dielectric layer 104 or the substrate 100.

In one embodiment, the bonding process may include pressing the substrate 100 towards the transparent substrate 114, and may include a two-step heating processes. For example, in the first step heating process, the temperature may be raised to 120° C. Then, in the second heating process, the temperature may be raised to 150° C. to complete the bonding process. Then, the structure as shown in FIG. 2E may be put into an oven and be heated to about 180° C. to perform a hard bake process to the patterned spacer layer (including the spacer layer 116' and the spacer layer 116") and the spacer layer material 116b. After the spacer layer material 116b is treated by the hard bake process, it may be completely cured to be the spacer layer material 116c. The polymer in the spacer layer material 116c may further crosslink with each other.

After the bonding process is performed, the spacer layer 116', the transparent substrate 114, and the planar layer 119 together surround a substantially closed cavity on the device region 102, and the spacer layer 116" and the spacer layer material 116c surround the spacer layer 116' and the surrounded cavity. The cavity may be used to contain an optical element such as a light filter layer 110 and a lens 112.

In the embodiments mentioned above, although the curing process of the spacer layer material 116b is performed before the bonding process is performed, embodiments of the invention are not limited thereto. In another embodiment, the curing process of the spacer layer material 116b is performed after the bonding process is performed. In this case, before the curing process is performed, the spacer layer material 116b in FIG. 2D is bonded with the substrate 100 to form a structure similar to that shown in FIG. 2E. Then, as shown in FIG. 2E, a light illumination process may be performed to the spacer layer material 116b after bonding such that the polymer in the spacer layer material 116b may further crosslink with each other. Then, a hard bake process is performed to form the spacer layer material 116c. Similarly, a soft bake process may also be performed to the spacer layer material 116b. The soft bake process may be performed before or after the bonding process is performed. In one embodiment, because the spacer layer material 116b is not cured before the bonding process is performed, it thus has better fluid characteristics, so the spacer layer material 116b may fill the opening of the dielectric layer 104 more easily and contact with the conducting pad 106. Thus, in this embodiment, there is substantially no gap between the spacer layer material 116b (or the spacer layer material 116c) and the conducting pad 106. Even if the size of the opening of the dielectric layer 104 is smaller, there is still substantially no gap between the spacer layer material 116b (or the spacer layer material 116c) and the conducting pad 106.

Figure 2F:
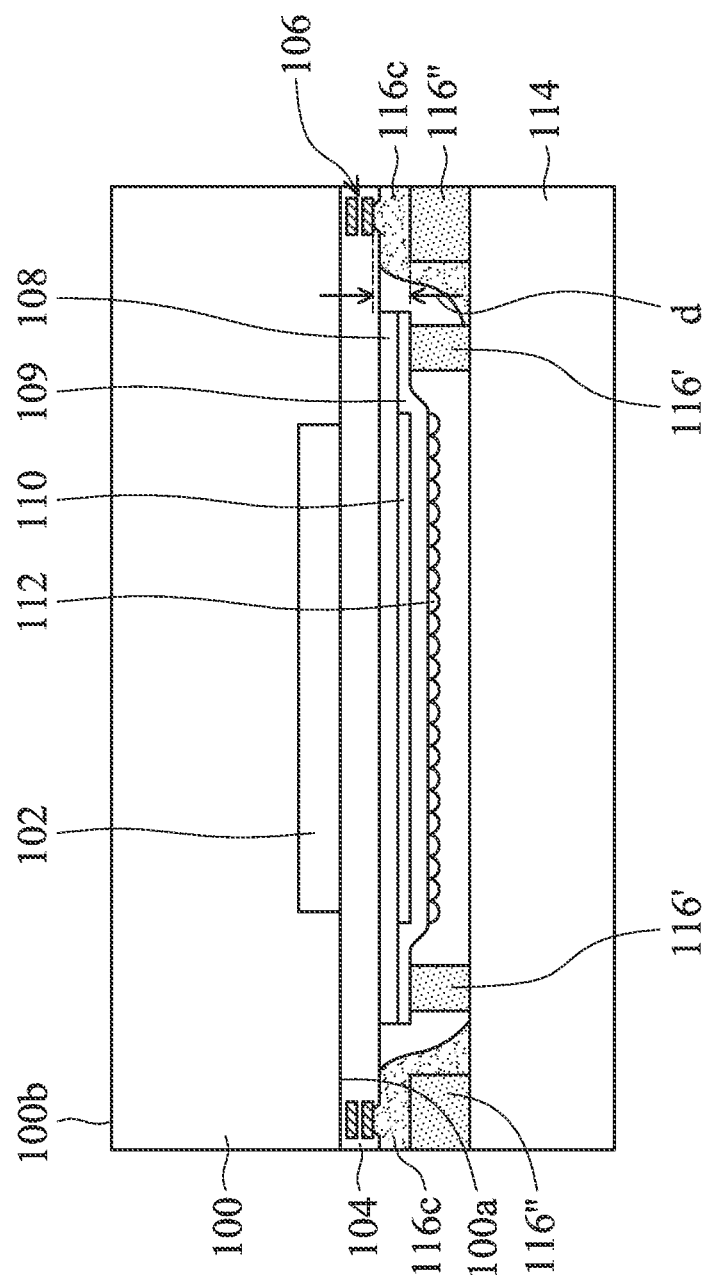

Next, as shown in FIG. 2F, a dicing process may be performed along the predetermined scribe line of the substrate 100 to form a plurality of chip packages separated from each other. Because the spacer layer 116" includes the recess 117, and a portion of the spacer layer material 116c extends into the recess 117 without completely filling the recess 117, there is still a portion of the recess without being filled with the spacer layer material 116c on the predetermined scribe line SC. When the dicing process is performed, the recess 117 may release the stress to prevent the chip package from being damaged. In addition, because there is substantially no gap between the spacer layer material 116c and the conducting pad 106, the structural reliability of the chip package is thus better and is not peeled or damaged due to the dicing process.

As shown in FIG. 2F, in one embodiment, because the materials of the spacer layer material 116c and the spacer layer 116" are the same, they may dissolve together after the hard bake process is performed. In this case, the interface between the spacer layer material 116c and the spacer layer 116" disappears or is not easily found. In one embodiment, the spacer layer 116' may serve as a first spacer layer of the chip package, and the spacer layer material 116c and the spacer layer 116" may together serve as a second spacer layer of the chip package. The height of the first spacer layer may be smaller than that of the second spacer layer. The second spacer layer may include a main portion (such as the spacer layer 116") and an extending portion (such as the spacer layer material 116c). The extending portion (the spacer layer material 116c) may cover the side surface of the main portion (the spacer layer 116"). In one embodiment, the extending portion (the spacer layer material 116c) may extend on the surface of the transparent substrate 114 and may extend towards the first spacer layer (the spacer layer 116') to directly contact with the first spacer layer (the spacer layer 116').

In the embodiments of the invention, even if the vertical distance d between the upper surface of the planar layer 109 and the upper surface of the conducting pad 106 is larger than about 2 µm, the transparent substrate 114 may still be firmly bonded on the substrate 100. The spacer layer may completely fill the opening of the dielectric layer and directly contact with the conducting pad 106, and there is substantially no gap between the spacer layer and the conducting pad 106. Thus, the subsequent dicing process causes substantially no damage to the chip package. In addition, the chip package of the embodiments of the invention have multiple spacer layers surrounding the optical elements, thus, the important elements of the chip package is ensured from being polluted by the external environment.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a substrate having a first surface and a second surface;
    a device region formed in the substrate or disposed on the substrate;
    a dielectric layer disposed on the first surface of the substrate;
    at least one conducting pad disposed in the dielectric layer and electrically connected to the device region;
    a planar layer disposed on the dielectric layer, wherein a vertical distance between an upper surface of the planar layer and an upper surface of the conducting pad is larger than about 2 µm;
    a transparent substrate disposed on the first surface of the substrate;
    a first spacer layer disposed between the transparent substrate and the planar layer; and
    a second spacer layer disposed between the transparent substrate and the substrate and extending into an opening of the dielectric layer to contact with the conducting pad, wherein there is substantially no gap between the second spacer layer and the conducting pad, wherein the second spacer layer comprises a main portion and an extending portion, and wherein the extending portion directly contacts with the first spacer layer.

2. The chip package as claimed in claim 1, wherein the first spacer layer directly contacts with the planar layer and does not contact with the dielectric layer or the substrate.

3. The chip package as claimed in claim 1, wherein the first spacer layer, the transparent substrate, and the planar layer together surround a substantially closed cavity on the device region, and the second spacer layer surrounds the first spacer layer.

4. The chip package as claimed in claim 3, further comprising an optical element disposed on the planar layer and located in the cavity.

5. The chip package as claimed in claim 4, wherein the optical element comprises a light filter layer, a color filter layer, a polarization layer, a lens, a light shielding layer, or combinations thereof.

6. The chip package as claimed in claim 1, wherein a height of the first spacer layer is larger than a height of the second spacer layer.

7. The chip package as claimed in claim 1, wherein the materials of the first spacer layer and the second spacer layer are the same.

8. A method for forming chip package having a combination of structures as claimed in claim 1, comprising:
    providing a substrate having a first surface and a second surface, wherein a device region is formed in the substrate or disposed on the substrate, a dielectric layer is disposed in the first surface of the substrate, at least one conducting pad is disposed in the dielectric layer and electrically connected to the device region, and a planar layer is disposed on the dielectric layer;
    providing a transparent substrate;
    forming a patterned spacer layer on a surface of the transparent substrate, wherein the patterned spacer layer comprises a first spacer layer and a main portion of a second spacer layer, the first spacer layer surrounds a region on the transparent substrate, and the main portion of the second spacer layer surrounds the first spacer layer;
    disposing a spacer layer material on an upper surface of the main portion of the second spacer layer to form an extending portion of the second spacer layer, wherein the extending portion directly contacts with the first spacer layer; and
    disposing the substrate on the transparent substrate, wherein the first spacer layer directly contacts with the planar layer, and the spacer layer material bonds with the dielectric layer and fills an opening of the dielectric layer to contact with the conducting pad.

9. The method for forming a chip package as claimed in claim 8, wherein the step of disposing the spacer layer material comprises:
    disposing a mask on the patterned spacer layer, wherein the mask has a hole exposing the upper surface of the second spacer layer;
    applying a spacer layer coating on the mask, wherein a portion of the spacer layer coating fills the hole of the mask to directly contact with the upper surface of the second spacer layer; and
    removing the mask such that the spacer layer material is left on the upper surface of the second spacer layer.

10. The method for forming a chip package as claimed in claim 8, before the step of disposing the substrate on the transparent substrate is performed, further comprising performing a curing process to the spacer layer material.

11. The method for forming a chip package as claimed in claim 10, wherein the curing process comprises performing a soft bake process, a light illumination process, or combinations thereof to the spacer layer material.

12. The method for forming a chip package as claimed in claim 10, further comprising performing a hard bake process to the patterned spacer layer and the spacer layer material.

13. The method for forming a chip package as claimed in claim 8, after the step of disposing the substrate on the transparent substrate is performed, further comprising performing a curing process to the spacer layer material.

14. The method for forming a chip package as claimed in claim 13, wherein the curing process comprises performing a soft bake process, a light illumination process, or combinations thereof to the spacer layer material.

15. The method for forming a chip package as claimed in claim 13, further comprising performing a hard bake process to the patterned spacer layer and the spacer layer material.

16. The method for forming a chip package as claimed in claim 8, further comprising performing a dicing process along a plurality of predetermined scribe lines of the substrate to form a plurality of chip packages.

17. The method for forming a chip package as claimed in claim 16, wherein the second spacer layer comprises a recess, a portion of the spacer layer material extends into the recess, and the recess is located on one of the predetermined scribe lines.

18. A chip package, comprising:
- a substrate having a first surface and a second surface;
- a device region formed in the substrate or disposed on the substrate;
- a dielectric layer disposed on the first surface of the substrate;
- at least one conducting pad disposed in the dielectric layer and electrically connected to the device region;
- a planar layer disposed on the dielectric layer;
- a transparent substrate disposed on the first surface of the substrate;
- a first spacer layer disposed between the transparent substrate and the planar layer; and
- a second spacer layer disposed between the transparent substrate and the substrate, wherein the second spacer layer comprises a main portion and an extending portion, and the extending portion covers a surface of the main portion and extends onto an opening of the dielectric layer to contact with the conducting pad, wherein the extending portion directly contacts with the first spacer layer.

19. The chip package as claimed in claim 18, wherein the extending portion of the second spacer layer covers a side surface of the main portion.

20. The chip package as claimed in claim 19, wherein the extending portion directly contacts with the transparent substrate.

21. The chip package as claimed in claim 18, wherein the materials of the main portion and the extending portion of the second spacer layer are the same.

22. The chip package as claimed in claim 18, wherein the materials of the first spacer layer and the second spacer layer are the same.

23. The chip package as claimed in claim 18, wherein the first spacer layer, the transparent substrate, and the planar layer together surround a substantially closed cavity on the device region, and the second spacer layer surrounds the first spacer layer.

24. A chip package, comprising:
- a substrate having a first surface and a second surface;
- a device region formed in the substrate or disposed on the substrate;
- a dielectric layer disposed on the first surface of the substrate;
- at least one conducting pad disposed in the dielectric layer and electrically connected to the device region;
- a planar layer disposed on the dielectric layer, wherein a vertical distance between an upper surface of the planar layer and an upper surface of the conducting pad is larger than about 2 μm;
- a transparent substrate disposed on the first surface of the substrate;
- a first spacer layer disposed between the transparent substrate and the planar layer; and
- a second spacer layer disposed between the transparent substrate and the substrate and extending into an opening of the dielectric layer to contact with the conducting pad, wherein there is substantially no gap between the second spacer layer and the conducting pad, wherein the first spacer layer and the second spacer layer are formed of non-conductive material.

25. The chip package as claimed in claim 24, wherein the first spacer layer directly contacts with the planar layer and does not contact with the dielectric layer or the substrate.

26. The chip package as claimed in claim 24, wherein the first spacer layer, the transparent substrate, and the planar layer together surround a substantially closed cavity on the device region, and the second spacer layer surrounds the first spacer layer.

27. The chip package as claimed in claim 26, further comprising an optical element disposed on the planar layer and located in the cavity.

28. The chip package as claimed in claim 27, wherein the optical element comprises a light filter layer, a color filter layer, a polarization layer, a lens, a light shielding layer, or combinations thereof.

29. The chip package as claimed in claim 24, wherein a height of the first spacer layer is larger than a height of the second spacer layer.

30. The chip package as claimed in claim 24, wherein the first spacer layer directly contacts with the second spacer layer.

31. The chip package as claimed in claim 24, wherein the first spacer layer does not directly contact with the second spacer layer.

32. The chip package as claimed in claim 24, wherein the materials of the first spacer layer and the second spacer layer are the same.

* * * * *